United States Patent
Jiang et al.

(10) Patent No.: US 11,042,806 B1
(45) Date of Patent: Jun. 22, 2021

(54) DEEP LEARNING FOR FIXABILITY PREDICTION OF POWER/GROUND VIA DRC VIOLATIONS

(71) Applicant: Synopsys, Inc., Mountain View, CA (US)

(72) Inventors: Yi-Min Jiang, Sunnyvale, CA (US); Xiang Qiu, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 73 days.

(21) Appl. No.: 16/581,935

(22) Filed: Sep. 25, 2019

Related U.S. Application Data

(60) Provisional application No. 62/736,091, filed on Sep. 25, 2018.

(51) Int. Cl.
| | |
|---|---|
| *G06F 9/455* | (2018.01) |
| *G06F 17/50* | (2006.01) |
| *G06N 5/04* | (2006.01) |
| *G06N 20/00* | (2019.01) |
| *G06F 30/398* | (2020.01) |

(52) U.S. Cl.
CPC ............ *G06N 5/04* (2013.01); *G06F 30/398* (2020.01); *G06N 20/00* (2019.01)

(58) Field of Classification Search
USPC .................................................. 716/111, 112
See application file for complete search history.

(56) References Cited

U.S. PATENT DOCUMENTS

| | | | | |
|---|---|---|---|---|
| 6,425,112 | B1 * | 7/2002 | Bula | G03F 1/36 716/52 |
| 2004/0151122 | A1 * | 8/2004 | Lau | H04W 28/0236 370/252 |
| 2008/0184183 | A1 * | 7/2008 | Kobayashi | G06F 30/398 716/52 |
| 2009/0271754 | A1 * | 10/2009 | Chang | G06F 30/394 716/129 |
| 2013/0185687 | A1 * | 7/2013 | Chung | G06F 30/398 716/111 |

\* cited by examiner

*Primary Examiner* — Brian Ngo
(74) *Attorney, Agent, or Firm* — Sterne, Kessler, Goldstein & Fox P.L.L.C.

(57) ABSTRACT

A computerized system is disclosed. The computerized system may include one or more processors configured to perform the operations stored in a memory. The operations may include receiving a first circuit design pattern including a DRC violation and generating a first pattern matrix based on the first circuit design pattern, and updating the first circuit design pattern, based on the first pattern matrix, to fix the DRC violation. The operations may also include determining a possibility of a DRC violation-free first circuit design pattern corresponding to the first pattern matrix, and generating a first target label specifying the fixability corresponding to the first pattern matrix based on the determined possibility of the DRC violation-free first circuit design pattern. The first pattern matrix and the first target label may be used as training data to train a machine-learning model to predict fixability of the DRC violation.

20 Claims, 8 Drawing Sheets

DEEP LEARNING FOR FIXABILITY PREDICTION OF POWER/GROUND VIA DRC VIOLATIONS

CROSS-REFERENCE TO RELATED APPLICATIONS

The present application claims priority under 35 U.S.C. § 119(e) to U.S. Provisional Patent Application No. 62/736,091 titled "Deep Learning for Fixability Prediction of Power/Ground Via DRC Violations" and filed on Sep. 25, 2018, which is hereby incorporated by reference in its entirety for all purposes.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, paragraph headings do not signify limitations. In these writings, the citation or identification of any publication signifies neither relevance nor status as prior art. Many paragraphs in this disclosure are common to multiple Synopsys patent specifications.

FIELD(S) OF TECHNOLOGY

The following information is solely for use in searching the prior art. This disclosure has significance in the field of electronics in general, including the following topics: electronic design automation.

BACKGROUND

Correct-by-construction power and ground (PG) routers create DRC-clean PG network by fixing design rule checking (DRC) violations of to-be-created wires/vias one wire/via at a time and drop PG wires/vias if the violations cannot be fixed. As the technology continues to scale down, design rules of routing and structure of PG vias become more complicated, which significantly increases the difficulty of fixing DRC violations of the to-be-created vias. DRC violation fixing is an iterative process, which fixes one DRC violation at a time. For certain complicated DRC violations, fixing DRC violations require many iterations, only to discover later that the violations cannot be fixed, and, therefore, the corresponding vias cannot be created. For designs with large number of such DRC violations, a significantly more amount of run time is spent on fixing the "unfixable" DRC violations of vias. As a result, fixing the "unfixable" DRC violations of vias has become one of the major time-consuming parts in PG router.

SUMMARY

This Summary is a prelude to the Detailed Description. This Summary, together with the independent Claims, signifies a brief writing about at least one claimed invention (which can be a discovery, see 35 USC 100(a); and see 35 USC 100(j)), for use in commerce that is enabled by the Specification and Drawings.

The claims signify a brief description of one or more of the innovations, embodiments, and/or examples found within this disclosure.

This disclosure describes a computerized system for predicting fixability of one or more design rule checking (DRC) violations. The computerized system may include a memory configured to store operations, and one or more processors configured to perform the operations including receiving a first circuit design pattern. The first circuit design pattern may include the DRC violation. The operations may further include generating a first pattern matrix based on the first circuit design pattern. The operations may also include updating the first circuit design pattern, based on the first pattern matrix, to fix the DRC violation. The operations may further include determining a possibility of a DRC violation-free circuit design pattern corresponding to the first pattern matrix. The operation may further include generating a first target label specifying the fixability corresponding to the first pattern matrix based on the determined possibility of the DRC violation-free first circuit design pattern.

This disclosure also describes a method for predicting fixability of one or more design rule checking (DRC) violations. The method may include receiving a first circuit design pattern. The first circuit design pattern may include the DRC violation. The method may further include generating a first pattern matrix based on the first circuit design pattern. The method may also include updating the first circuit design pattern, based on the first pattern matrix, to fix the DRC violation. The method may further include determining a possibility of a DRC violation-free first circuit design pattern corresponding to the first pattern matrix. The method may further include generating a first target label specifying the fixability corresponding to the first pattern matrix based on the determined possibility of the DRC violation-free first circuit design pattern.

This disclosure also describes a non-transitory computer-readable device having instructions stored thereon that, when executed by at least one computing device, causes the at least one computing device to perform operations including receiving a first circuit design pattern. The first circuit design pattern may include a DRC violation. The operations may further include generating a first pattern matrix based on the first circuit design pattern. The operations may also include updating the first circuit design pattern, based on the first pattern matrix, to fix the DRC violation. The operations may further include determining a possibility of a DRC violation-free first circuit design pattern corresponding to the first pattern matrix. The operation may further include generating a first target label specifying the fixability corresponding to the first pattern matrix based on the determined possibility of the DRC violation-free first circuit design pattern.

This Summary does not completely signify the claimed inventions. This Summary (as well as the Abstract) neither signifies essential elements of, nor limits the scope of, the claimed inventions enabled by the Specification and Figures.

DRAWINGS

The following Detailed Description, Figures, and Claims signify the uses and advantages of the claimed inventions, and their embodiments. All of the Figures are used only to provide knowledge and understanding and do not limit the scope of the claimed inventions and their embodiments. Such Figures are not necessarily drawn to scale.

Similar components or features used in the Figures can have the same, or similar, reference signs in the form of labels (such as alphanumeric symbols, e.g., reference numerals), and can signify a similar or equivalent use. Further, various components of the same type can be distinguished by following the reference label by a dash and a second label that distinguishes among the similar components. If only the first reference label is used in the Specification, its use applies to any similar component having the same first reference label irrespective of the second reference label. A brief description of the Figures is below.

In the Figures, reference signs can be omitted as is consistent with accepted engineering practice; however, a skilled person will understand that the illustrated components are readily understood when viewed in the context of the illustration as a whole and the accompanying disclosure describing such various figures.

DETAILED DESCRIPTION

The Figures and Detailed Description signify, only to provide knowledge and understanding, the claimed inventions. To minimize the length of the Detailed Description, while various features, structures or characteristics can be described together in a single embodiment, they also can be used in other embodiments without being written about. Variations of any of these elements, and modules, processes, machines, systems, manufactures or compositions disclosed by such embodiments and/or examples are easily used in commerce. The Figures and Detailed Description also can signify, implicitly or explicitly, advantages and improvements of the claimed inventions and their embodiments for use in commerce.

In the Figures and Detailed Description, numerous specific details can be described to enable at least one embodiment of the claimed inventions. Any embodiment disclosed herein signifies a tangible form of a claim invention. To not obscure the significance of the embodiments and/or examples in this Detailed Description, some elements that are known to a skilled person can be combined together for presentation and for illustration purposes and not be described in detail. To not obscure the significance of these embodiments and/or examples, some well-known processes, machines, systems, manufactures or compositions are not written about in detail. However, a skilled person can use these embodiments and/or examples in commerce without these specific details or their equivalents. Thus, the Detailed Description focuses on enabling the distinctive elements of the claimed inventions and exemplary embodiments. Where this Detailed Description refers to some elements in the singular tense, more than one element can be depicted in the Figures and like elements are labeled with like numerals.

Detailed Description—Traditional Approach of DRC Violation Fixing

Figure 1A:
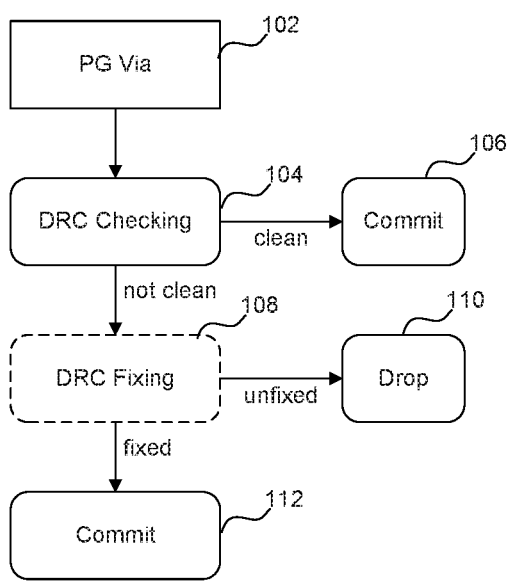
FIG. 1a illustrates a traditional approach of DRC violation fixing.

FIG. 1a illustrates a traditional approach of Power/Ground (PG) via creation. A circuit board may generally contain a plurality of transistors, gates, and other components that are required to have wires/via connected to them for power and ground connection. The wires/via that provide power and ground connection are known as Power/Ground (PG) wires/via. The circuit design requires physical checks of metal width, pitch, spacing, and other requirements for different layers based on the technology of the node being designed. Accordingly, design rule check (DRC) confirms that the all requirements of metal width, pitch, spacing, and others are met. Any violation of DRC needs to be fixed for the node or circuit to perform the specific task for which it is designed. By way of non-limiting example, the DRCs may include minimum width and spacing for metal, minimum spacing between custs, minimum/maximum number of cuts, specific sizes of cuts for via, minimum area, shorts violation, less than minimum edge length, etc.

As shown in FIG. 1a, at step 102, a circuit design pattern of one or more PG vias is received for analysis. At step 104, for each via, DRC checking is performed to see if there are any DRC violations against the via. The via may be created or committed if there is no DRC violation against the via. Accordingly, if checking at step 104 suggests that the via is clean from any DRC violation, the via may be committed at step 106. However, if at step 104, it is determined that the via is not free from a DRC violation, the DRC violation should be fixed as shown at step 108, otherwise the circuit may fail to perform an expected function. The process of fixing a DRC violation depends on the type of DRC violation, which is beyond the scope of this disclosure. Therefore, this disclosure does not describe or address a specific way to fix a DRC violation. A DRC fixing engine may analyze each DRC violation and try to fix each DRC violation at step 108. For certain complicated DRC violations, DRC fixing engine needs to go through many iterations, only to discover that the DRC violation cannot be fixed. If at step 108, it was determined that the DRC violation cannot be fixed, the particular via may be dropped as shown at step 110. For designs with a large number of to-be-created vias with complicated DRC violations, a significant amount of time will be wasted on trying to fix the unfixable vias. On the other hands, after many iterations of DRC violation fixing, if a DRC violation-free via can be produced, the via may be committed as shown at step 112.

Detailed Description—Exemplary DRC Violation Fixability Prediction Approach

Figure 1B:
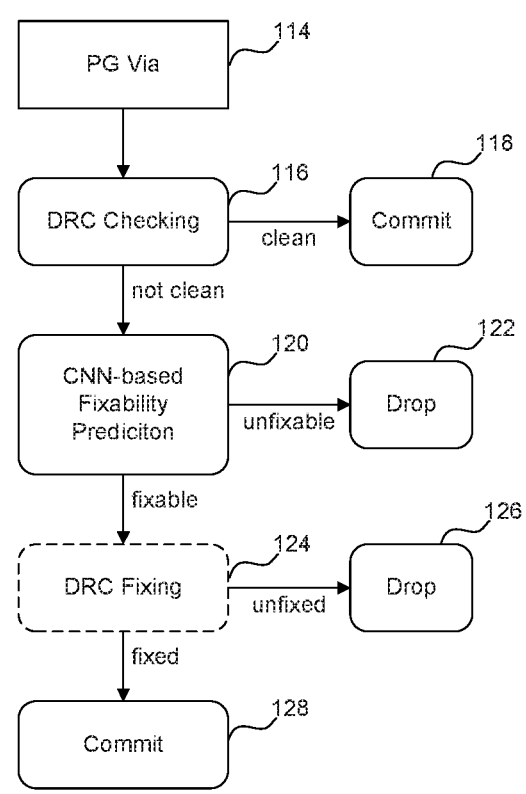
FIG. 1b illustrates DRC violation fixing of a via, according to an exemplary embodiment of the present disclosure.

FIG. 1b illustrates DRC violation fixing of via, according to an exemplary embodiment of the present disclosure.

Particularly, FIG. 1b illustrates an algorithm or flow chart of predicting fixability of a to-be-fixed via for runtime reduction. As described above, for complicated DRC violations, it takes substantial time for the DRC fixing engine to fix the DRC violations. However, the time to fix the DRC violations may be reduced, if it can be predicted that the DRC violations for the via are unfixable or fixable, and thereby reducing the number of iterations of DRC violation fixing without an ability to fix the DRC violations. As described above with reference to FIG. 1a, at step 114, a circuit design pattern of one or more PG vias is received for analysis.

At step 116, for each via, DRC checking is performed to see if there are any DRC violations against the via. The via may be created or committed if there is no DRC violation against the via. Accordingly, if checking at step 116 suggests that the via is clean from any DRC violation, the via may be committed at step 118. However, if at step 116, it is determined that the via is not free from DRC violations, instead of fixing the DRC violations by DRC fixing engine as described above at step 108, fixability prediction of the to-be-fixed via with the DRC violations may be performed at step 120.

At step 120, because DRC violations exist against the via, information from a DRC violation report corresponding to the DRC violations may be extracted. The extracted information and a fixability prediction model may be used to predict if the particular DRC violations can be fixed by the DRC fixing engine. The fixability prediction model may be pre-built and may be a machine-learning model. If the prediction result is unfixable, then the via may be dropped as shown at step 122, but if the prediction result is fixable, the DRC fixing engine may go through each DRC violation if more than one DRC violation exist, and fix them as described earlier with reference to FIG. 1a. It may also happen that fixing one DRC violation may create another DRC violation. Accordingly, after going through many iterations of DRC violation fixing as it may be required at step 124, either the via may be dropped as shown at step 126 if the DRC violation-free via is not possible, or the via may be committed as shown at step 128 if the DRC violation-free via is generated. A clear advantage of this approach of verifying the DRC violations for its fixability based on the fixability prediction model is no time wasted on unfixable via.

As shown in the table below, the runtime and quality of results (QoR) of four industrial designs are compared for the traditional approach of DRC violation fixing and the DRC violation fixing using DRC violation fixability prediction model. The second column in the table refers to the PG creation runtime with fixability prediction model as described in this disclosure. The third column in the table refers to the PG creation runtime without fixability prediction model—a traditional approach. The column 4 represents speed-up over the traditional approach. Columns 5 to 10 are QoR according to the embodiments as described in this disclosure with the reference of the traditional approach. Column 5 is the total number of vias. Column 6 is total number of to-be-fixed vias. The number of vias which are unable to be fixed by current fixing engine is show in column 7. Column 8 is the number of unfixable vias that correctly predicted as unfixable by fixability prediction model (true negative). Column 9 is prediction precision which is defined as true negative over total predicted negative (true negative+ false negative). For the application of PG creation, precision of negative prediction is much more important than the one of positive prediction because number of false negative may be the number of fixable vias which can be created in traditional approach but not created based on the fixability prediction model. The last column in the table (column 10) is the missed ratio, which is defined as the ratio of number of false negative over total number of vias.

TABLE 1

Comparison of traditional approach with fixability prediction model

| | Runtime | | | QoR | | | | | |
|---|---|---|---|---|---|---|---|---|---|
| Design | With Fixability Prediction Model | Without Fixability Prediction Model | Speed-up | # of total Vias | # of to-be-fixed vias | # of unfixable vias | # of true negative | Prediction Precision | Missed ratio (%) |
| 1 | 190 | 868 | 4.6X | 1706263 | 994343 | 808812 | 769140 | 93.5 | 3.1 |
| 2 | 156 | 606 | 3.9X | 2991221 | 2884087 | 2282142 | 2187032 | 94.5 | 4.2 |
| 3 | 6 | 20 | 3.3X | 1611684 | 829935 | 659341 | 616921 | 94.1 | 2.4 |
| 4 | 7 | 16 | 2.3X | 1135602 | 889104 | 649449 | 646876 | 99.5 | 0.3 |

In the table above, true negative represents unfixable that was correctly labeled as unfixable and false negative represents fixable that was mislabeled as unfixable. Prediction precision may be calculated as a ratio of true negative to a total of true negative and false negative, i.e., ((true_negative)/(true_negative+false_negative)). Missed ratio may be calculated as a ration of number of false_negative to number of total vias, i.e., ((# of false_negative)/(# of total vias)).

Detailed Description—Exemplary DRC Violation Report

Figure 2:
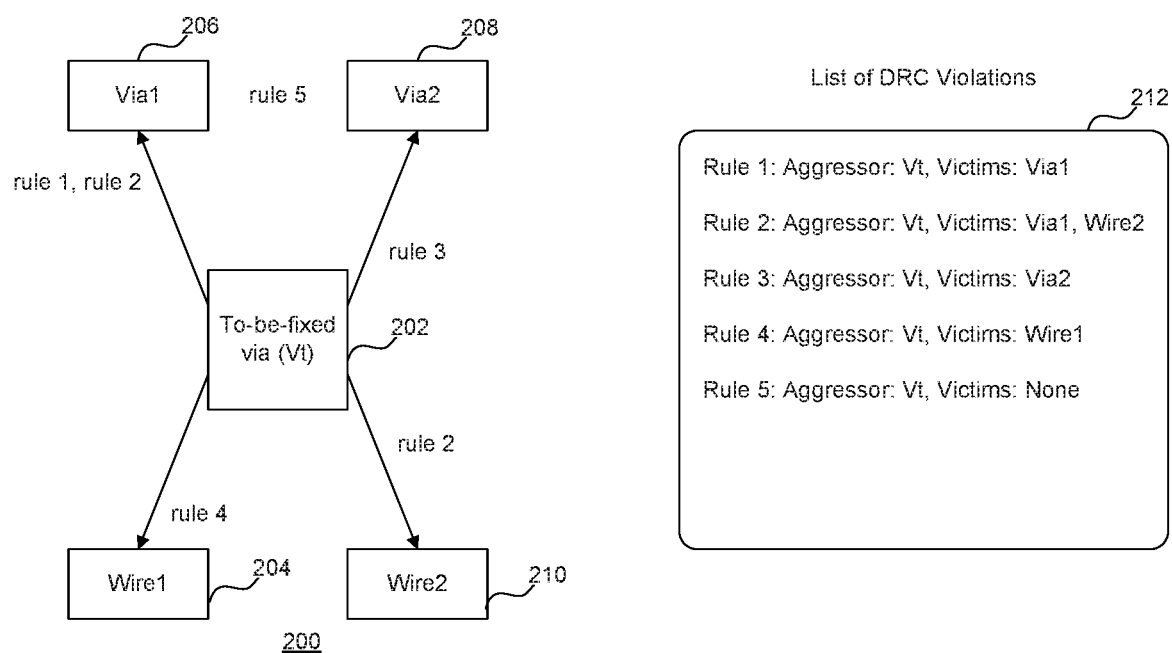
FIG. 2 illustrates an exemplary DRC violation report, according to an exemplary embodiment of the present disclosure.

FIG. 2 illustrates an exemplary DRC violation report, according to an exemplary embodiment of the present disclosure. Particularly, FIG. 2 shows a DRC violation report of a via. A via, as a person skilled in the art may know, contains geometries in three layers. The three layers may be top layer, cut or middle layer, and bottom layer. For explanation purpose, only geometries of top layer of a to-be-added via 200 is shown in FIG. 2. A to-be-added via 202 (marked as Vt), and existing vias/wires Via 1 206, Via 2 208, Wire1 204, and Wire 2 210 which encounter DRC violations against the via Vt 202 are shown. The via Vt may also be referred as an aggressor, and the existing via/wires may be referred as victims. Also shown in FIG. 2, is a list of violated DRC rules 212. The list of violated DRC rules 212 may comprise each DRC rule being violated and the corresponding aggressor and victims. There are two possible outcomes of fixing the DRC violations: fixable or unfixable. The fixing outcome may be known only after applying DRC fixing. The DRC fixing as described above is an iterative process, which fixes one violation in one iteration. Fixing one violation may lead to more violations, which in turn, needs more iterations to fix the violations. Furthermore, not all the violations can be fixed. As compared to fixable violations, PG router usually takes a long time to know unfixable violations because it needs to go through a large number of iterations to find it out. To save runtime on the "unfixable" violations, machine learning techniques may be employed to predict fixability of DRC violations and recognize the "unfixable" violations. The predicted unfixable violations are not fixed and corresponding vias are dropped.

In order to use a machine learning technique to identify fixable versus unfixable DRC violations, a machine learning model needs to be trained to recognize if a circuit design pattern is fixable or unfixable. Accordingly, the first step of prediction of fixability of DRC violations may be pattern recognition of the design. For this step, the actual DRC rules being violated may be ignored focusing on the aggressor and victims.

Detailed Description—Exemplary Two-Dimensional Pattern

Figure 3:
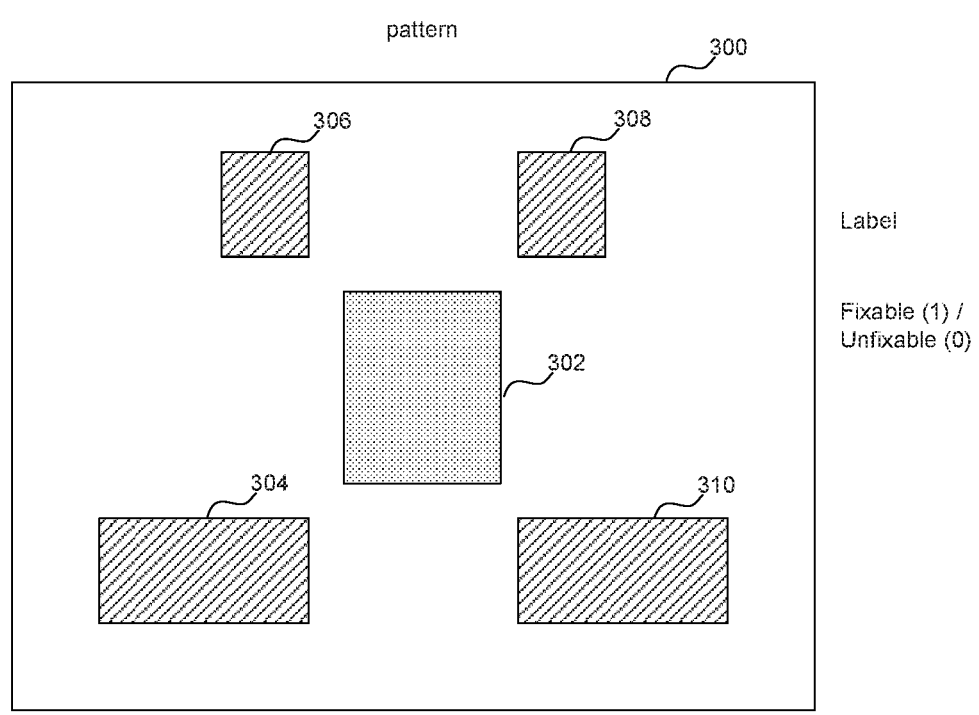
FIG. 3 illustrates a two-dimensional pattern matrix, according to an exemplary embodiment of the present disclosure.

FIG. 3 illustrates a two-dimensional pattern, according to an exemplary embodiment of the present disclosure. By way of non-limiting example, as shown in FIG. 3, a center of the aggressor 302 may be aligned with a center of a two-dimensional plane 300. The two-dimensional plane 300 may be of pre-defined height and width, and location of each victim on the plane may be determined based on a spatial relationship of the victim with the aggressor 302. Accordingly, victims 304, 306, 308, and 310 are shown on the two-dimensional plane 300 maintaining spatial relationship with the aggressor 302. If DRC violations for the design pattern 300 may be determined as fixable, fixability of the pattern 300 of the aggressor 302 and victims 304, 306, 308, and 310 may be recorded as 1 or True. If the DRC violations for the design pattern 300 of the aggressor 302 and victims 304, 306, 308, and 310 may be determined as unfixable, fixability of the pattern 300 may be recorded as 0 or False.

Detailed Description—Exemplary Two-Dimensional Pattern Matrix

Figure 4:
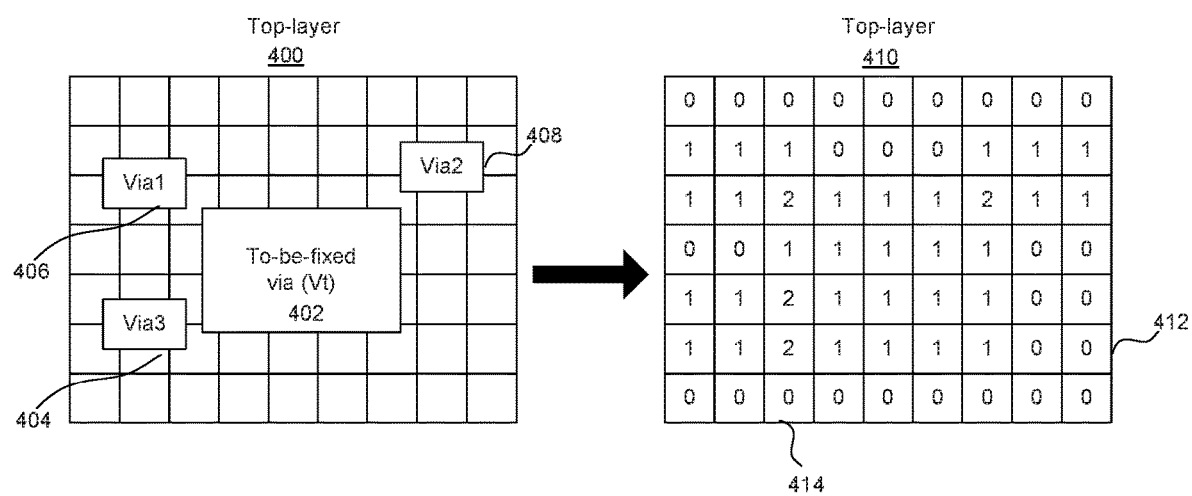
FIG. 4 illustrates a three-dimensional pattern matrix, according to an exemplary embodiment of the present disclosure.

FIG. 4 illustrates a two-dimensional pattern matrix, according to an exemplary embodiment of the present disclosure. As shown in FIG. 4, the two-dimensional pattern 400 that may be similar to the two-dimensional pattern 300 discussed above may be divided into a plurality of pre-defined horizontal and vertical grids. An aggressor 402 and victims 404, 406, and 408 are shown maintaining their spatial relationship with the aggressor 402. As described above, the plurality of horizontal and vertical grids is configurable and/or pre-defined. By way of non-limiting example, the two-dimensional pattern 400 has seven horizontal and nine vertical grids with 63 total cells. Accordingly, a two-dimensional pattern matrix 410 may be generated which may represent the aggressor and the victims based on their location on the grid. A value in each cell of the matrix may represent a total number of objects in the cell. For example, in a cell at an intersection of a row 412 and a column 414, there are two objects, the aggressor 402 and the victim 404. Accordingly, the cell at the intersection of the row 412 and the column 414 may be assigned a value 2. Accordingly, all cells may be assigned a value as shown in FIG. 4. As described above, the via contains geometries in three layers. As described above with reference to the top layer, two-dimensional pattern and two-dimensional pattern matrix for the cut/middle layer and the bottom layer may be created. The two-dimensional pattern matrix generated for the top, middle, and bottom layers may then be concatenated to generate a three-dimensional pattern matrix. The three-dimensional pattern matrix may be used to train machine learning model.

Detailed Description—Exemplary Fixability Prediction Model

Figure 5:
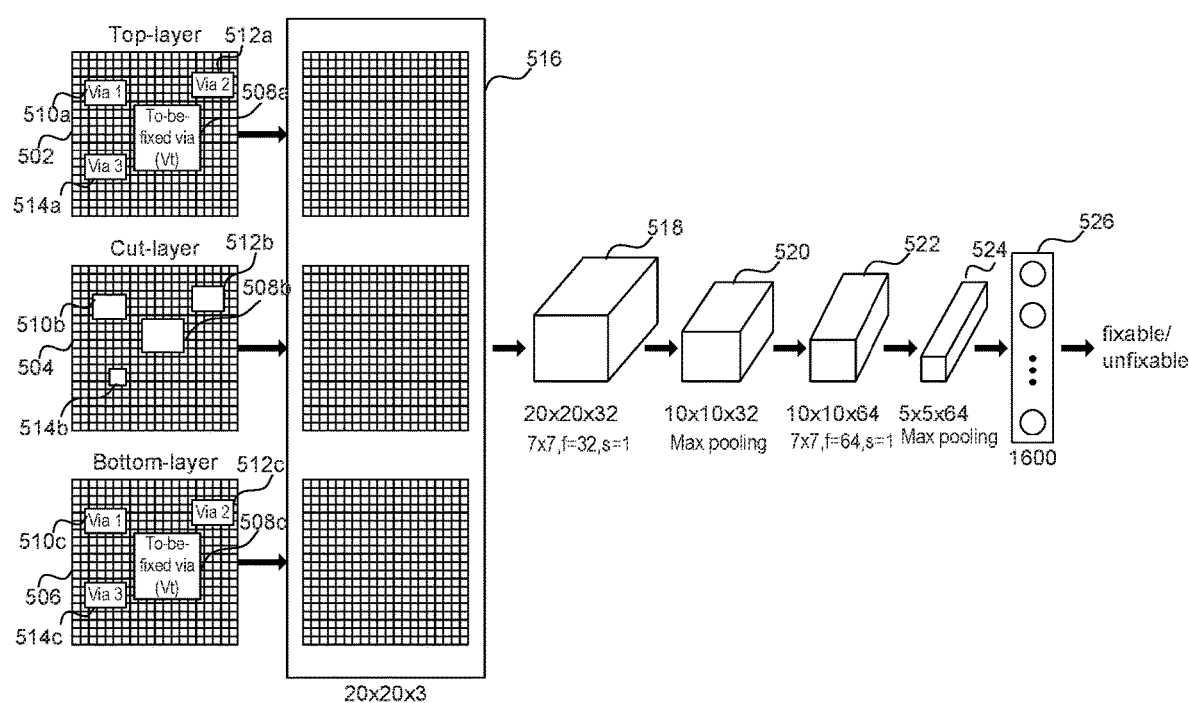
FIG. 5 illustrates a fixability prediction model, according to an exemplary embodiment of the present disclosure.

FIG. 5 illustrates a fixability prediction model, according to an exemplary embodiment of the present disclosure. Particularly, FIG. 5 illustrates a convolutional neural-network based fixability prediction model. As shown in FIG. 5, a two-dimensional pattern matrix for a top layer 502, a two-dimensional pattern matrix for a cut or middle layer 504, and a two-dimensional pattern matrix for a bottom layer 506 are shown. Further, an aggressor is shown for the top, middle, and bottom layers. The aggressor in the top layer is labeled as 508a. The aggressor in the middle and bottom layer is labeled as 508b and 508c respectively. Similarly, victims via1, via2, via3 in the top, middle, and bottom layers are shown as 510a, 512a, 514a, 510b, 512b, 514b, 510c, 512c, and 514c respectively. As described above, the plurality of horizontal and vertical grids is configurable and/or predefined. By way of non-limiting example, the two-dimensional pattern matrix of the top, middle, and bottom layer have twenty horizontal and twenty vertical grids. Accordingly, a three-dimensional pattern matrix 516 generated from concatenation of the two-dimensional pattern matrixes has a size of 20×20×3.

As described above, to train machine learning model for fixability prediction, as described in the previous paragraphs, fixability of DRC violations as a result of fixing by DRC fixing engine may be recorded along with the corresponding three-dimensional pattern matrix. Accordingly, a machine learning model may be built that takes the three-dimension pattern matrix as inputs and generates fixability as fixable (1) or unfixable (0) as label (output). By way of non-limiting example, this disclosure describes convolutional neural network (CNN) based machine-learning model. However, other machine-leaning models such as neural network, support vector machine, etc., may also be used.

As known to a person skilled in the art, convolutional neural network (CNN) is a technique to efficiently capture local spatial pattern in data for recognition and classification. CNN may be used to capture a pattern in the DRC violation report in order to classify if the DRC violations of a via can be fixed by current DRC fixing engine. For a to-be-fixed via or the aggressor represented as 508a, 508b, and 508c, DRC checking engine may report a list of victim objects. By way of non-limiting examples, the victim objects are 510a-c, 512a-c, and 514a-c. The geometry information of these the aggressor and the victims or victim objects may then be mapped to a three-dimension tensor. By way of non-limiting example, the three-dimension tensor may be of size 20×20×3. The first two numbers represent a 20×20 grid on the X-Y plane, while the last number denotes three different physical layers that the via resides (top enclosure layer, cut layer, and bottom enclosure layer). The value of the element in the matrix is equal to the number of objects in each cell of the grid as described above. The three-dimensional pattern matrix 516 may be an input to the machine learning model. Since this disclosure describes machine learning model training based on CNN, as described above, the three-dimensional pattern matrix 516 as input goes through a first convolutional layer 518. By way of non-limiting example, the first convolutional layer may comprise 32 7×7 filters with stride 1, followed by rectified-linear-unit (relu) activation function and a maximum pooling layer 520. After that, the data may be further processed by the second convolutional layer 522. By way of non-limiting example, the second convolutional layer may comprise 64 7×7 filters with stride 1, followed by the relu activation function and a maximum pooling layer 524. The last layer 526 of the model may be a fully connected layer with sigmoid activation function, outputting a binary value (1 or 0) to denote if the via is fixable or not. As described above, the binary value 1 may indicate the DRC violations are fixable and the binary value 0 may indicate the DRC violations are unfixable.

Detailed Description—Exemplary Training Data Generation

Figure 6:
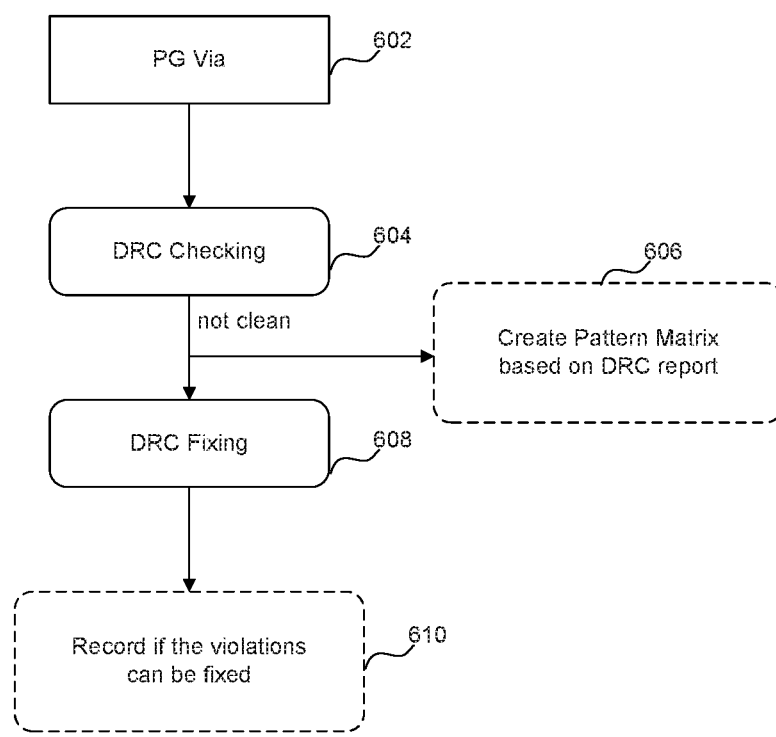
FIG. 6 illustrates a flow chart of generating training data, according to an exemplary embodiments of the present disclosure.

FIG. 6 illustrates a flow chart of generating training data, according to an exemplary embodiment of the present disclosure. To train the model, required training data be generated from a traditional PG router, i.e., without machine learning model, to create a plurality of power/ground vias of various sizes and cut types. A module may then extract DRC violation checking and DRC violation fixing results of each to-be-fixed via and use them to create training data to train the machine learning model. Each to-be-fixed via may be referred to as one instance of training data. The input of a training data is a three-dimensional pattern matrix, which is computed based on DRC violation report. The output (label) of a training data may be fixability (fixable or unfixable), which may be obtained from DRC fixing results. After that, all the training data and corresponding output (label) may be used to train the machine learning model.

As shown in FIG. 6 and as described above, at step 602, a PG via is received for analysis. At step 604, DRC checking may be performed to determine if the PG via includes a DRC violation. At step 604, if it is determined that the PG via is not DRC violation-free, a three-dimensional pattern matrix may be created using a procedure described above at step 606. Also, at step 608, the DRC fixing engine may go through one or more iterations of fixing the DRC violations. After each DRC violation is fixed, more DRC violations may occur. The DRC violation fixing and DRC checking may be performed until a predetermined and/or configurable number of iterations to fix the DRC violation are completed. If the DRC violations are not yet fixed, after the predetermined and/or configurable number of iterations, the DRC violations corresponding to the three-dimensional pattern matrix may be identified/classified as unfixable (0) at step 610. If the DRC violations are fixed within the predetermined and/or configurable number of iterations, the DRC violations corresponding to the three-dimensional pattern matrix may be identified/classified as fixable (1) at step 610.

While DRC fixing engine attempts to fix a DRC violation, after each DRC violation fixing, DRC checking is performed again. Accordingly, another three-dimensional pattern matrix may be generated corresponding to an updated design pattern based on the DRC violation fixing. If the DRC fixing engine could generate a DRC violation-free via within the predetermined and/or configurable number of iterations, then all three-dimensional matrixes generated while fixing DRC violations for the PG via may be classified as fixable (1). If the DRC fixing engine could not generate a DRC violation-free via within the predetermined and/or configurable number of iterations, then all three-dimensional matrixes generated while fixing DRC violations may be classified as unfixable (0). Thus, from a single PG via many training data may be generated. Training data therefore may include one or more three-dimensional pattern matrixes and corresponding target labels generated while fixing one or more DRC violations of the PG via.

During runtime, after DRC checking, the trained machine-learning model may be used to first check whether DRC violations is fixable or unfixable corresponding to a three-dimensional matrix for the PG via to-be-created. If based on the trained model, it is determined that for the three-dimensional matrix for the PG via to-be-created, the DRC violations are unfixable, PG via may be dropped. If it is determined that the DRC violations are fixable, the DRC fixing engine may be applied to fix the DRC violations. One DRC violation fixing may create new DRC violations. Hence, DRC fixing engine may iterate over the predetermined and/or configurable number of iterations for DRC violation fixing and checking. If DRC violations are fixed within the predetermined and/or configurable number of iterations, the PG via is committed, otherwise the PG via is dropped.

The model may be trained only once for each technology node with same technology data, and then may be used across designs with the same technology data. The training may be done at customers' sites using customers' PG network, which may allow the model to be adaptive to customers' needs. Further, even though this disclosure is related to fixing DRC violation with reference to PG vias, this disclosure may equally apply to fix DRC violations for other types of circuit designs and/or technologies.

Detailed Description—Technology Support from Data/Instructions to Processors/Programs Data and Information. While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of'(e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a conductive wire or an optical fiber, with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Examples of types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information. For example, the term 'module' can signify a process that transforms data and information, for example, a process comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then be restructured to comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU', an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

Detailed Description—Technology Support General Computer Explanation

Figure 8A:
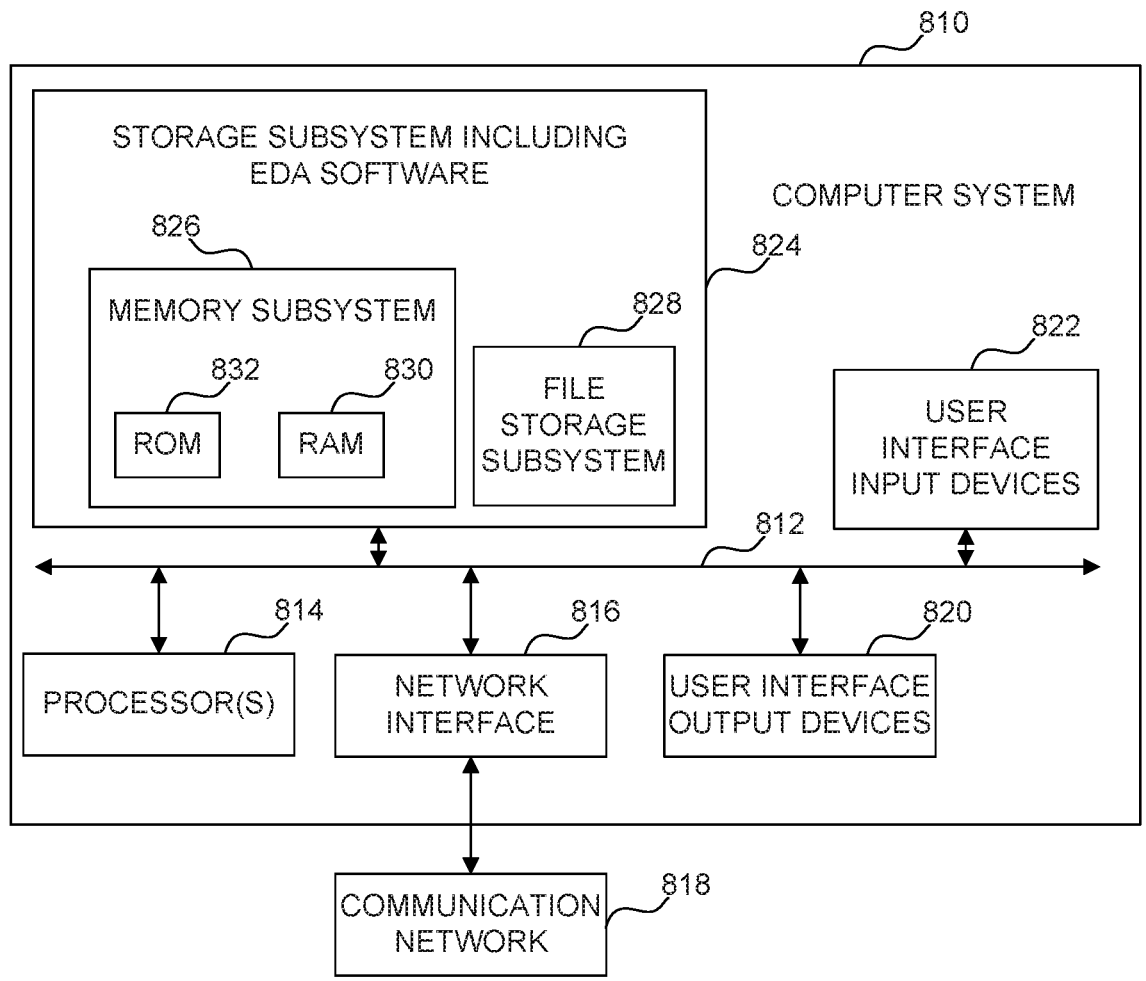
FIGS. 8A and 8B depict abstract diagrams of a computer system for use in commerce, if needed, by embodiments of the claimed inventions, as well as an embodiment of a circuit design and an embodiment of a manufactured circuit used in these claimed inventions.
Figure 8B:
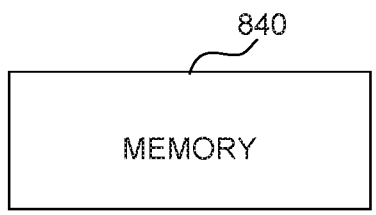

FIGS. 8A and 8B are abstract diagrams of a computer system suitable for enabling embodiments of the claimed inventions.

In FIG. 8A, the structure of computer system 810 typically includes at least one computer 814 which communicates with peripheral devices via bus subsystem 812. Typically, the computer includes a processor (e.g., a microprocessor, graphics processing unit, or digital signal processor), or its electronic processing equivalents, such as an Application Specific Integrated Circuit ('ASIC') or Field Programmable Gate Array ('FPGA'). Typically, peripheral devices include a storage subsystem 624, comprising a memory subsystem 826 and a file storage subsystem 828, user interface input devices 822, user interface output devices 820, and/or a network interface subsystem 816. The input and output devices enable direct and remote user interaction with computer system 810. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, such as Microsoft's Windows, Sun Microsystems's Solaris, Apple Computer's MacOs and iOS, Google's Android, Linux and/or Unix. The computer system typically includes a Basic Input/Output System (BIOS) and processor firmware. The operating system, BIOS and firmware are used by the processor to structure and control any subsystems and interfaces connected to the processor. Typical processors that enable these operating systems include: the Pentium, Itanium and Xeon processors from Intel; the Opteron and Athlon processors from Advanced Micro Devices; the Graviton processor from Amazon; the POWER processor from IBM; the SPARC processor from Oracle; and the ARM processor from ARM Holdings.

The claimed inventions and their embodiments are limited neither to an electronic digital logic computer structured with programs nor to an electronically programmable device. For example, the claimed inventions can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 810 depicted in FIG. 8A is intended only as an example. Many other structures of computer system 810 have more or less components than the computer system depicted in FIG. 8A.

Network interface subsystem 816 provides an interface to outside networks, including an interface to communication network 818, and is coupled via communication network 818 to corresponding interface devices in other computer systems or machines. Communication network 818 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 818 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. Communication algorithms ('protocols') can be specified using one or communication languages, such as HTTP, TCP/IP, RTP/RTSP, IPX and/or UDP.

User interface input devices 822 can include an alphanumeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 810 or onto communication network 818. User interface input devices typically enable a user to select objects, icons, text and the like that appear on some types of user interface output devices, for example, a display subsystem.

User interface output devices 820 can include a display subsystem, a printer, a fax machine, or a non-visual communication device such as audio and haptic devices. The display subsystem can include a cathode ray tube (CRT), a flat-panel device such as a liquid crystal display (LCD), an image projection device, or some other device for creating visible stimuli such as a virtual reality system. The display subsystem also can provide non-visual stimuli such as via audio output, aroma generation, or tactile/haptic output (e.g., vibrations and forces) devices. Typically, the term 'output device' signifies all possible types of devices and processes to transfer data and information out of computer system 810 to the user or to another machine or computer system. Such devices are connected by wire or wirelessly to a computer system. Note: some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits that use any of the above input or output devices.

Memory subsystem 826 typically includes a number of memories including a main random-access memory ('RAM') 830 (or other volatile storage device) for storage of instructions and data during program execution and a read only memory (ROM') 832 in which fixed instructions are stored. File storage subsystem 828 provides persistent storage for program and data files, and can include a hard disk drive, a floppy disk drive along with associated removable media, a CD-ROM drive, an optical drive, a flash memory such as a USB drive, or removable media cartridges. If computer system 810 includes an input device that performs optical character recognition, then text and symbols printed on paper can be used as a device for storage of program and data files. The databases and modules used by some embodiments can be stored by file storage subsystem 828.

Bus subsystem 812 provides a device for transmitting data and information between the various components and subsystems of computer system 810. Although bus subsystem 812 is depicted as a single bus, alternative embodiments of the bus subsystem can use multiple busses. For example, a main memory using RAM can communicate directly with file storage systems using Direct Memory Access (DMA') systems.

FIG. 8B depicts a memory 840 such as a non-transitory, processor readable data and information storage medium associated with file storage subsystem 828, and/or with network interface subsystem 816, and can include a data structure specifying a circuit design. The memory 840 can be a hard disk, a floppy disk, a CD-ROM, an optical medium, removable media cartridge, or any other medium that stores computer readable data in a volatile or non-volatile form, such as text and symbols on paper that can be processed by an optical character recognition system. A program transferred in to and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

Detailed Description—Technology Support EDA System/Workflow Explanation

Figure 7:
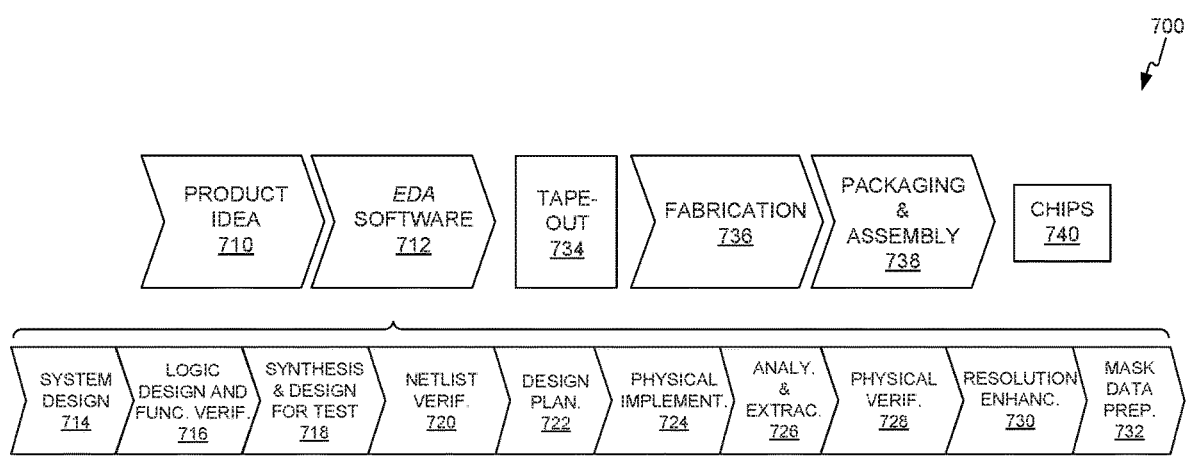
FIG. 7 depicts a flowchart of various processes used during the design and manufacture of an integrated circuit.

FIG. 7 depicts a set of processes 700 used during the design, verification and fabrication of an article of manufacture such as an integrated circuit to transform and verify design data and instructions that represent the integrated circuit. Each of these processes can be structured and enabled as multiple modules. The term 'EDA' signifies the term 'Electronic Design Automation'. These processes start with the creation of a product idea 710 with information supplied by a designer, information which is transformed to create an article of manufacture that uses a set of EDA processes 712. When the design is finalized, it is taped-out 734, which typically is when artwork (e.g., geometric patterns) for the integrated circuit is sent to a fabrication facility to manufacture the mask set, which is then used to manufacture the integrated circuit. After tape-out, a semiconductor die is manufactured 736 and packaging and assembly processes 738 are performed to produce the finished integrated circuit 740.

Specifications for a circuit or electronic structure are as used in commerce at multiple levels of useful abstraction ranging from low-level transistor material layouts to high-level description languages. Most designers start with a description using one or more modules with less detail at a high-level of abstraction to design their circuits and systems, using a hardware description language ('HDL') such as VHDL, Verilog, SystemVerilog, SystemC, MyHDL or OpenVera. The high-level description is easier for designers to understand, especially for a vast system, and can describe very complex systems that are difficult to understand using a lower level of abstraction that is a more detailed description. The HDL description can be transformed into other levels of abstraction that are used by the developers. For example, a high-level description can be transformed to a logic-level register transfer level ('RTL') description, a gate-level description, a layout-level description, or a mask-level description. Each lower abstraction level that is a less abstract description adds more useful detail into the design description, for example, more details for the modules that comprise the description. The lower-levels of abstraction that are less abstract descriptions can be generated by a computer, derived from a design library, or created by another design automation process. An example of a specification language at a lower level of abstraction language for specifying more detailed descriptions is SPICE, which is much used for detailed descriptions of circuits with many analog components. A circuit specification for a circuit also has value as an article of manufacture in commerce as a good under the Uniform Commercial Code (see U.C.C. Article 2, Part 1). Descriptions at each level of abstraction are enabled for use by the corresponding tools of that layer (for example, a formal verification tool), and some of the modules of the abstractions need not be novel or unobvious.

A design process that uses EDA processes 712 includes processes 714 to 732, which are described below. This design flow description is used only to illustrate, not to limit. For example, a designer of an integrated circuit design can use the design processes in a different sequence than the sequence depicted in FIG. 5. For the embodiments disclosed herein, products from Synopsys, Inc. of Mountain View, Calif. (hereinafter signified by 'Synopsys'), are used to enable these processes, and/or similar products from other companies.

During system design 714, a designer specifies the functionality to be manufactured. The designer also can optimize the power, performance and area (physical and/or lines of code) and minimize costs, etc. Partitioning of the design into different types of modules can occur at this stage. Exemplary EDA products from Synopsys that enable system design 714 include: the Model Architect, Saber, System Studio, and Designware products.

During logic design and functional verification 716, modules in the circuit are specified in one or more description languages, and the specification is checked for functional accuracy, that is, that the modules produce outputs that match the requirements of the specification of the circuit or system being designed. Exemplary HDL languages are Verilog, VHDL and SystemC. Functional verification typically uses simulators and other programs such as testbench generators, static HDL checkers and formal verifiers. In some situations, special systems of modules referred to as 'emulators' or 'prototyping systems' are used to speed up the functional verification. Exemplary EDA products from Synopsys that can be used at this stage include: VCS, Vera, Designware, Magellan, Formality, ESP and Leda products. Exemplary emulator and prototyping products available from Synopsys that enable logic design and functional verification 716 include: Zebu® and Protolink® (® signifies 'Registered Trademark').

During synthesis and design for test 718, HDL code is transformed to a netlist (which typically is a graph structure where the edges represent components of a circuit and where the nodes represent how the components are interconnected). Both the HDL code and the netlist are hierarchical articles of manufacture that can be used by an EDA product to verify that the integrated circuit, when manufactured, performs according to its design. This netlist can be optimized for a target semiconductor manufacturing technology. Additionally, the finished integrated circuit is tested to verify that it satisfies the requirements of the specification. Exemplary EDA products from Synopsys that enable synthesis and design for test 718 include: the Design Compiler, Physical Compiler, Test Compiler, Power Compiler, FPGA Compiler, Tetramax, and Designware products.

During netlist verification 720, the netlist is checked for compliance with timing constraints and for correspondence with the HDL code. Exemplary EDA products from Synopsys that enable netlist verification 720 include: the Formality, Primetime, and VCS products.

During design planning 722, an overall floor plan for the integrated circuit is constructed and analyzed for timing and top-level routing. Exemplary EDA products from Synopsys that enable design planning 722 include: the Astro and IC Compiler products.

During layout implementation 724, physical placement (positioning of circuit components such as transistors or capacitors) and routing (connection of the components by multiple conductors) occurs, and the selection of cells from a library to enable specific logic functions. As used herein, the term 'cell' signifies a set of transistors, other components, and interconnections that provides a Boolean logic function (e.g., AND, OR, NOT, XOR) or a storage function (such as a flipflop or latch). As used herein, a circuit 'block' comprises two or more cells. Both a cell and a circuit block can be referred to as a module, and are enabled as both physical structures and in simulations. Parameters are specified for selected cells (based on 'standard cells') such as size, and made accessible in a database for use by EDA products. Examples of databases that can be used for accessing cells include MySQL and PostgreSQL. Exemplary EDA products from Synopsys that enable layout implementation 724 include: the Astro and IC Compiler products.

During analysis and extraction 726, the circuit function is verified at the layout level, which permits refinement of the layout design. Exemplary EDA products from Synopsys that enable analysis and extraction 726 include: the Astrorail, Primerail, Primetime, and Star RC/XT products.

During physical verification 728, the layout design is checked to ensure that manufacturing constraints are correct, such as DRC constraints, electrical constraints, lithographic constraints, and that circuitry function matches the HDL design specification. Exemplary EDA products from Synopsys that enable physical verification 728 include: the Hercules product.

During resolution enhancement 730, the geometry of the layout is transformed to improve how the design is manufactured. Exemplary EDA products from Synopsys that enable resolution enhancement 730 include: the *Proteus* product.

During tape-out, data is created to be used (after lithographic enhancements are applied if appropriate) for production of lithography masks. Example EDA products from Synopsys that enable tape-out include: the IC Compiler and Custom Designer products.

During mask-data preparation 732, the 'tape-out' data is used to produce lithography masks that are used to produce finished integrated circuits. Exemplary EDA products from Synopsys that enable mask-data preparation 732 include: the CATS family of products.

For all of the abovementioned EDA products, similar products from other EDA vendors, such as Cadence, Siemens, other corporate entities or various non-commercial products from universities, or open source repositories, can be used as an alternative.

A storage subsystem of a computer system (such as computer system 610 of FIG. 6A) is preferably used to store the programs and data structures that are used by some or all of the EDA products described herein, and products used for development of cells for the library and for physical and logical design that use the library.

Detailed Description—Semantic Support

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology for use in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} for use in commerce—or improves upon an existing solution used in commerce {see Diehr})— is precisely defined by the inventor(s) {see MPEP 2111.01 ($9^{th}$ edition, Rev. 08.2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract' } how the commercial solution differs from equivalent prior art solutions; or b) a new commercial solution is 'abstract' if the existing prior art includes at least one analogous prior art solution {see KSR}, or the existing prior art includes at least two prior art publications that can be combined {see Alice} by a skilled person {often referred to as a 'PHOSITA', see MPEP 2141-2144 ($9^{th}$ edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

Detailed Description—Definitions

As used herein, the semiotic function RUD(t, p1, p2, . . . ) signifies that a skilled person can obtain, if needed for progressing the useful arts, a reasonably useful definition of the signifier 't' that comprises the union of definitions of T in one or more U.S. Patents and U.S. Patent Applications 'p1', 'p2', etc. For example, 'RUD(substantially, 9532624)' signifies that a skilled person can obtain a reasonably useful definition of 'substantially' as it is defined in U.S. Pat. No. 9,532,624.

DEFINITIONS: RUD(substantially, 9532624).

DETAILED DESCRIPTION—CONCLUSION

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the claims.

What is claimed:

1. A computerized system for predicting fixability of a design rule checking (DRC) violation, the computerized system comprising:
   a memory configured to store operations; and
   one or more processors configured to perform the operations, the operations comprising:
      receiving a first circuit design pattern comprising the DRC violation,
      generating a first pattern matrix based on the first circuit design pattern,
      based on the first pattern matrix, updating the first circuit design pattern to fix the DRC violation,
      determining a possibility of a DRC violation-free first circuit design pattern corresponding to the first pattern matrix, and
      generating a first target label specifying the fixability corresponding to the first pattern matrix based on the determined possibility of the DRC violation-free first circuit design pattern.

2. The computerized system of claim 1, wherein for the generating the first pattern matrix, the operations further comprise:
   dividing the first circuit design pattern into a plurality of layers;
   generating a plurality of two-dimensional pattern matrixes, each two-dimensional pattern matrix of the plurality of two-dimensional pattern matrixes corresponding to a layer of the plurality of layers; and
   concatenating the plurality of two-dimensional pattern matrixes to generate a three-dimensional pattern matrix as the first pattern matrix.

3. The computerized system of claim 2, wherein for the generating the plurality of two-dimensional pattern matrixes, the operations further comprise:
   applying a layer of the plurality of layers onto a two-dimensional plane of a plurality of horizontal grids and a plurality of vertical grids, wherein the plurality of horizontal grids and the plurality of vertical grids are configurable;
   identifying an aggressor node and at least one victim node;
   positioning the aggressor node and the at least one victim node on the two-dimensional plane maintaining a spatial relationship between the aggressor node and the at least one victim node; and
   assigning a count of objects corresponding to a cell of the two-dimensional plane of the plurality of horizontal and vertical grids, wherein the objects comprise the aggressor node and the at least one victim node.

4. The computerized system of claim 1, wherein the operations further comprise:
   storing the updated first circuit design pattern to fix the DRC violation as a second circuit design pattern;
   generating a second pattern matrix corresponding to the second circuit design pattern;
   determining a possibility of a DRC violation-free second circuit design pattern corresponding to the second pattern matrix; and
   generating a second target label specifying the fixability corresponding to the second pattern matrix based on the determined possibility of the DRC violation-free second circuit design pattern.

5. The computerized system of claim 4, wherein the generating the second circuit design pattern is repeated for a configurable number of times before the second target label is marked as unfixable.

6. The computerized system of claim 4, wherein the operations further comprise:
   training a machine learning algorithm using training data, the training data comprising the first pattern matrix, the second pattern matrix, the first target label, and the second target label.

7. The computerized system of claim 1, wherein the operations further comprise:
   training a machine learning algorithm using training data, the training data comprising the first pattern matrix and the first target label.

8. A method for predicting fixability of a design rule checking (DRC) violation, the method comprising:
   receiving a first circuit design pattern comprising the DRC violation;
   generating a first pattern matrix based on the first circuit design pattern;
   based on the first pattern matrix, updating the first circuit design pattern to fix the DRC violation;
   determining a possibility of a DRC violation-free first circuit design pattern corresponding to the first pattern matrix; and
   generating a first target label specifying the fixability corresponding to the first pattern matrix based on the determined possibility of the DRC violation-free first circuit design pattern.

9. The method of claim 8, wherein the generating the first pattern matrix further comprises:
   dividing the first circuit design pattern into a plurality of layers;
   generating a plurality of two-dimensional pattern matrixes, each two-dimensional pattern matrix of the plurality of two-dimensional pattern matrixes corresponding to a layer of the plurality of layers; and
   concatenating the plurality of two-dimensional pattern matrixes to generate a three-dimensional pattern matrix as the first pattern matrix.

10. The method of claim 9, wherein the generating the plurality of two-dimensional pattern matrixes further comprises:
applying a layer of the plurality of layers onto a two-dimensional plane of a plurality of horizontal grids and a plurality of vertical grids, wherein the plurality of horizontal grids and the plurality of vertical grids are configurable;
identifying an aggressor node and at least one victim node;
positioning the aggressor node and the at least one victim node on the two-dimensional plane maintaining a spatial relationship between the aggressor node and the at least one victim node; and
assigning a count of objects corresponding to a cell of the two-dimensional plane of the plurality of horizontal and vertical grids, wherein the objects comprise the aggressor node and the at least one victim node.

11. The method of claim 8, further comprising:
storing the updated first circuit design pattern to fix the DRC violation as a second circuit design pattern;
generating a second pattern matrix corresponding to the second circuit design pattern;
determining a possibility of a DRC violation-free second circuit design pattern corresponding to the second pattern matrix; and
generating a second target label specifying the fixability corresponding to the second pattern matrix based on the determined possibility of the DRC violation-free second circuit design pattern.

12. The method of claim 11, wherein the generating the second circuit design pattern is repeated for a configurable number of times before the second target label is marked as unfixable.

13. The method of claim 11, further comprising training a machine learning algorithm using training data, the training data comprising the first pattern matrix, the second pattern matrix, the first target label, and the second target label.

14. The method of claim 8, further comprising training a machine learning algorithm using training data, the training data comprising the first pattern matrix and the first target label.

15. A non-transitory, tangible computer-readable device having instructions stored thereon that, when executed by at least one computing device, causes the at least one computing device to perform operations comprising:
receiving a first circuit design pattern comprising a device rule checking (DRC) violation;
generating a first pattern matrix based on the first circuit design pattern;
based on the first pattern matrix, updating the first circuit design pattern to fix the DRC violation;
determining a possibility of a DRC violation-free first circuit design pattern corresponding to the first pattern matrix; and
generating a first target label specifying fixability corresponding to the first pattern matrix based on the determined possibility of the DRC violation-free first circuit design pattern.

16. The non-transitory, tangible computer-readable device of claim 15, wherein for the generating the first pattern matrix, the operations further comprise:
dividing the first circuit design pattern into a plurality of layers;
generating a plurality of two-dimensional pattern matrixes, each two-dimensional pattern matrix of the plurality of two-dimensional pattern matrixes corresponding to a layer of the plurality of layers; and
concatenating the plurality of two-dimensional pattern matrixes to generate a three-dimensional pattern matrix as the first pattern matrix.

17. The non-transitory, tangible computer-readable device of claim 16, wherein for the generating the plurality of two-dimensional pattern matrixes, the operations further comprise:
applying a layer of the plurality of layers onto a two-dimensional plane of a plurality of horizontal grids and a plurality of vertical grids, wherein the plurality of horizontal grids and the plurality of vertical grids are configurable;
identifying an aggressor node and at least one victim node;
positioning the aggressor node and the at least one victim node on the two-dimensional plane maintaining a spatial relationship between the aggressor node and the at least one victim node; and
assigning a count of objects corresponding to a cell of the two-dimensional plane of the plurality of horizontal and vertical grids, wherein the objects comprise the aggressor node and the at least one victim node.

18. The non-transitory, tangible computer-readable device of claim 15, wherein the operations further comprise:
storing the updated first circuit design pattern to fix the DRC violation as a second circuit design pattern;
generating a second pattern matrix corresponding to the second circuit design pattern;
determining a possibility of a DRC violation-free second circuit design pattern corresponding to the second pattern matrix; and
generating a second target label specifying the fixability corresponding to the second pattern matrix based on the determined possibility of the DRC violation-free second circuit design pattern.

19. The non-transitory, tangible computer-readable device of claim 18, wherein the generating the second circuit design pattern is repeated for a configurable number of times before the second target label is marked as unfixable.

20. The non-transitory, tangible computer-readable device of claim 15, wherein the operations further comprise:
training a machine learning algorithm using training data, the training data comprising the first pattern matrix and the first target label.

* * * * *